Figure 1:
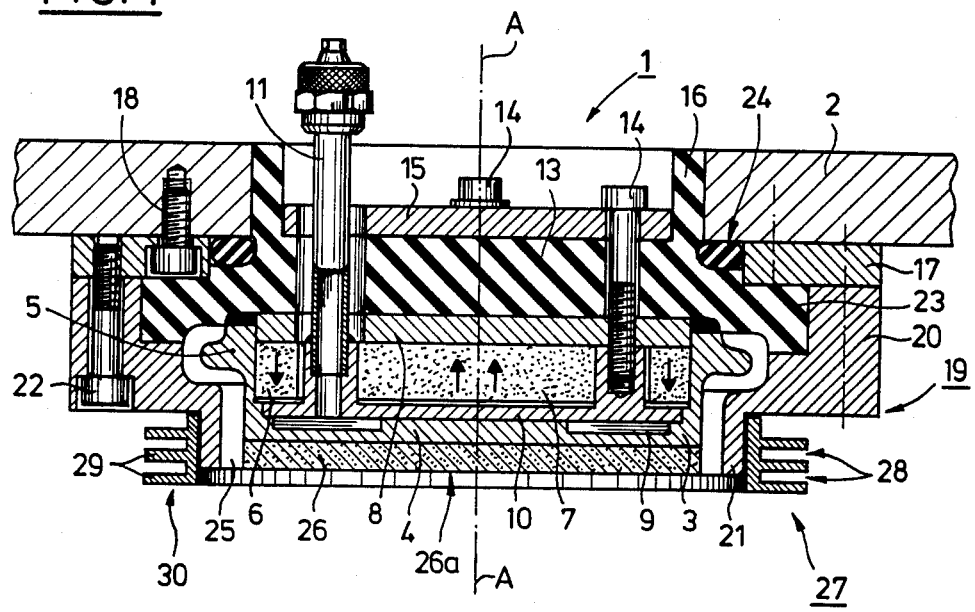

United States Patent [19]

Hessberger et al.

[11] Patent Number: 4,619,755
[45] Date of Patent: Oct. 28, 1986

[54] SPUTTERING SYSTEM FOR CATHODE SPUTTERING APPARATUS

[75] Inventors: Gerhard Hessberger, Karlstein; Michael Scherer, Rodenbach, both of Fed. Rep. of Germany

[73] Assignee: Hans Zapfe, Rodgau-3, Fed. Rep. of Germany

[21] Appl. No.: 759,026

[22] Filed: Jul. 25, 1985

[30] Foreign Application Priority Data

Jul. 26, 1984 [DE] Fed. Rep. of Germany ....... 3427587

[51] Int. Cl.$^4$ ............................................. C23C 15/00
[52] U.S. Cl. ................................. 204/298; 204/192.1
[58] Field of Search ............................ 204/298, 192 R

[56] References Cited

U.S. PATENT DOCUMENTS

| 3,514,391 | 5/1970 | Hablanian et al. | 204/298 |
| 3,617,463 | 11/1971 | Greger et al. | 204/298 |
| 3,748,253 | 7/1973 | Provenzano et al. | 204/298 |
| 4,046,660 | 9/1977 | Fraser | 204/298 |
| 4,074,140 | 2/1978 | Edenhofer | 204/298 |
| 4,288,307 | 9/1981 | Wasa et al. | 204/298 |

Primary Examiner—Arthur P. Demers
Attorney, Agent, or Firm—Felfe & Lynch

[57] ABSTRACT

Sputtering system for cathode sputtering apparatus, having a cathode base body with a target of the material to be sputtered. In the marginal part of the target an anode is disposed which is provided with at least one groove. For the solution of the problem of obtaining stable operating conditions in the lengthy coating of substrates with insulating materials and of drawing a high portion of the cathode current to the anode for a long period of time, the at least one groove opens, in accordance with the invention, on a side of the anode that is not in line of sight with the target.

5 Claims, 6 Drawing Figures

SPUTTERING SYSTEM FOR CATHODE SPUTTERING APPARATUS

BACKGROUND OF THE INVENTION

The invention relates to a sputtering system for cathode sputtering apparatus, consisting of a cathode base with a target of the material to be sputtered, of a darkspace shield separated by an air gap from the cathode base body, and of an anode disposed in the area of the margin of the target and having at least one open groove whose opening is disposed in a side of the anode that is not in line of sight with the target.

In cathode sputtering apparatus, the anode, as its name signifies, serves for closing the circuit with respect to the cathode. The anode serves for capturing or for the removal of the electrons pertaining to the sputtering process and involved in this typical glow discharge.

In many known sputtering systems, the vacuum chamber that is at ground potential—the so-called receptacle—serves as the anode. However, for reasons of the control of the process, it has proven desirable to provide a separate anode directly adjacent the cathode or target, which can be connected directly to the ground or can be placed at the ground potential, or which is set at a potential level—usually positive—with respect to ground. In the present case, too, what is involved is a sputtering apparatus having an additional anode present.

Now, by no means does the material sputtered from the cathode travel only in a straight line and only in a direction perpendicular to the sputtered surface of the target, to the substrate which is movable or fixed with respect to this sputtered surface. Instead, the coating material is distributed through the space, so that it precipitates or condenses more or less strongly also on the anode.

Insofar as the coating material is electrically conductive, which is regularly the case in the sputtering of metals in a neutral or nonreactive atmosphere, the transition resistances in the circuit between cathode and anode are not negatively affected even in the course of lengthy coating processes. In numerous applications in electronics and optics, and in the coating of large-area window glass, however, coatings of nonconductive materials—so-called dielectrics—are required. These coatings can be produced both by the sputtering of oxide-forming metals in a reactive atmosphere, as well as by sputtering targets made from the oxides themselves. Experience has shown that inevitably a more or less large proportion of the sputtered material condenses on the anode in the form of the reaction product, and there forms an insulating surface coating which, as its thickness increases or as time goes on, increasingly reduces the anode current. This results not only in uncontrollably unstable operating conditions, but also in extremely undesirable flashovers when highly localized surface charges form on the insulating surface coating of the anode, which from time to time discharge and gretly interfere with the sputtering process.

There has been no lack of attempts, therefore, to remove the anode as far as possible away from the glow region in the vicinity of the target surface. For example, German Federal publication OS No. 24 17 228 recommends mounting the anode outside of the glow discharge as well as outside of the direction of the migration of the sputtered particles of the target material. Aside from the fact that this goal is virtually unattainable, this impairs or delays the entry of the electrons into the anode, so that the anode draws to itself only a small part of the cathode current. The greater part of the cathode current then necessarily flows to the inside surfaces of the vacuum chamber that is at ground potential, or to fittings in the vacuum chamber that are at ground potential, including especially the substrate holder which, in the case of support material in continuous web form can also be a rotating cylinder. The consequences are, again, unstable operating conditions which are unacceptable in a continuous process.

The anode, therefore, has been taken out of its sheltered place and brought to the immediate vicinity of the target, in the hope that, by a high temperature level that will thus necessarily be produced (the glow discharge attacks the anode directly), either the coating of the anode will be prevented, or the anode will be "cleaned." It is also virtually impossible, in this case, to sustain stable operating conditions over a long period of time in the sputtering of insulating or dielectric materials. This is because the requirements of long anode life or long-term constant operating conditions on the one hand, and very good electrical coupling of the anode on the other are virtually opposed to one another.

Through German Federal publication OS No. 22 43 708, it is known to dispose an annular anode in the marginal area of flange of an otherwise substantially cylindrical cathode. In one of the annular anode surfaces, which is in line-of-sight relationship to the target material, concentric grooves are provided, which serve to improve the adherence of the sputtered material impinging upon the anode. This does make it possible to a gret extent to prevent the material, which is undesired at this point, from peeling off and falling after it reaches a certain thickness; it is impossible, however, to forestall increasing insulation by the impingement of insulating materials (dielectrics or even appreciably to suppress it. It is precisely interlocking with the anode surface that assures the growth of an especially thick insulating layer, which necessitates frequent cleaning of the anode.

German Federal OS No. 26 36 293 discloses a cathode sputtering apparatus whereby different materials are to be sputtered either simultaneously or successively. To prevent a so-called cross-contamination of the target material by the condensation of target material of a different cathode, shields are disposed between the cathodes or electrodes on the one hand and the substrates or substrate holder on the other, these shields being at ground potential and consequently exercising an anode function to a certain extent. This anode function, however, deteriorates in the course of time, whenever the sputtering of dielectrics is involved. A labyrinth formed by grooves in the faces of the shields cannot replace or sustain the anode function, because the grooves are too far away from the actual sputtering surface and from the area in which the glow discharge is burning which produces the sputtering.

The invention is therefore addressed to the problem of devising a sputtering system of the kind described in the beginning, which will assure stable operating conditions over long periods in the coating of substrates with insulating materials, and in which the anode will draw to itself a high proportion of the cathode current.

THE INVENTION

The solution of the stated problem is achieved in accordance with the invention, in the sputtering apparatus described above, by disposing the anode on the margin of the dark space shielding, and by aligning the side walls of the at least one groove substantially parallel to the sputtering surface of the target.

In such an arrangement, the at least one groove (preferably a plurality of parallel grooves is provided) is disposed in the closest possible vicinity of the sputtering surface of the target and thus of the glow discharge. Nevertheless it does not serve for interlocking with the condensed material, since at this point, and on account of the alignment of the grooves, very much less material impinges than on the side of the anode that is closer to the target.

The groove or grooves virtually completely prevent the penetration of coating material, over a comparatively very long period of time, and even if this does happen, the buildup of insulating layers at this point takes place so very slowly that the entrance of electrons is sustained over a very long period of operation.

With an anode thus configured and disposed, stable operating conditions are assured over long periods of time; consequently the removal or cleaning of the anode is necessary only at very great intervals of time, and, especially, the number of voltage flashovers does not increase progressively as time goes on.

The conditions become all the more favorable the greater the number of grooves is and the greater is the ratio of the groove depth (T) to the groove width (B). It is especially advantageous if the ratio of the groove depth to groove width amounts to at least 1.5:1. In this case only an extremely small part of the coating materials reaches the bottom of the grooves, so that any insulating effect will not become manifest until after a very long time. Even the formation of so-called secondary plasmas, which lead to glow discharges outside of the actual sputtering surface, is prevented. The number of flashovers does not increase progressively with time. Thus, end products of repeatably high quality can be made.

Furthrmore, the time between the necessary servicing and inspections of the apparatus is lengthened, so that the apparatus can be utilized more economically.

The subject matter of the invention can find application in the so-called diode system, i.e., in a system in which, aside from the cathode and the anode, no other electrodes are present in the coating apparatus. The invention, however, can be applied to special advantage in the case of the so-called magnetron cathode, in which a magnet system is situated on the back of the target, which produces over the sputtering surface a closed tunnel of magnetic lines of force which holds the glow discharge at this point and increases the sputtering effect, the so-called sputtering rate, by at least a factor of 10.

The anode can be grounded, i.e., can be at the ground potential, but it can also be mounted in an insulated manner, either with or without connection to a special anode potential. There is no absolute need for the anode to be geometrically similar to the shape of the cathode, nor is symmetrical arrangement absolutely necessary.

The anode of the invention has proven to be especially suitable in the production of dielectric coatings of $SnO_2$, $In_2O_3$, $SnO$, $Ta_2O_3$ and TiC from the corresponding metals. It is, however, also very suitable for sputtering targets consisting of insulating materials, such as $SiO_2$, SiN, SiON, $Al_2O_3$, $In_2O_3$, $SnO_2$ and SiC.

Advantageous developments of the subject matter of the invention are the subject of subordinate claims.

Examples of the embodiment of the invention and of its manner of operation will be further explained hereinbelow in conjunction with FIGS. 1 to 6, appended hereto.

SUMMARY DESCRIPTION OF THE DRAWINGS

Figure 2:
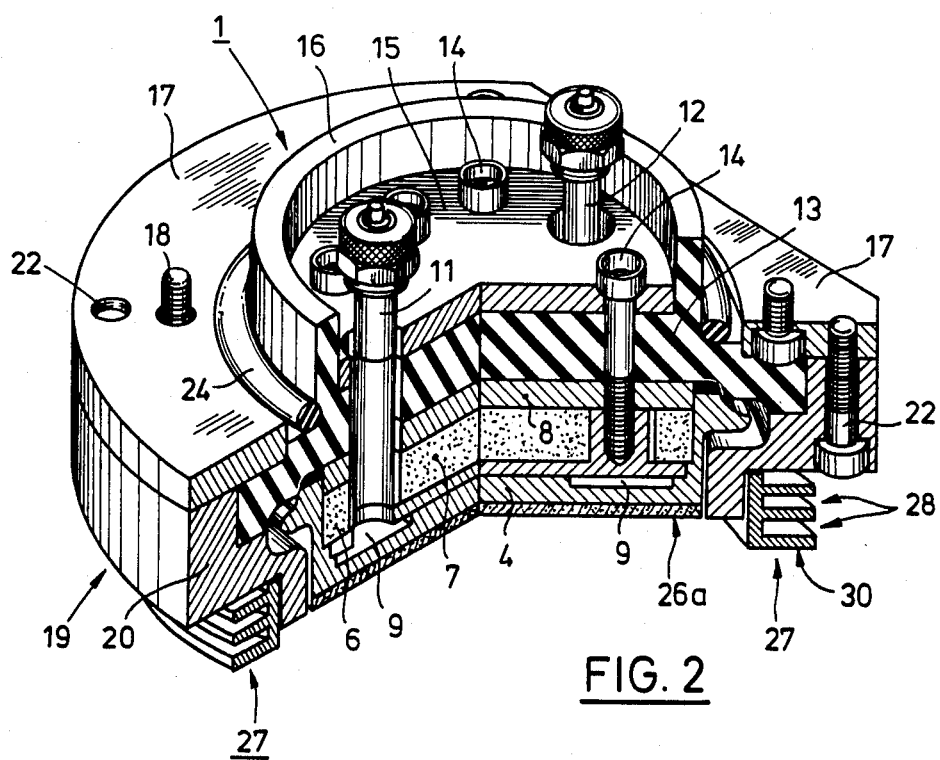
Figure 3:
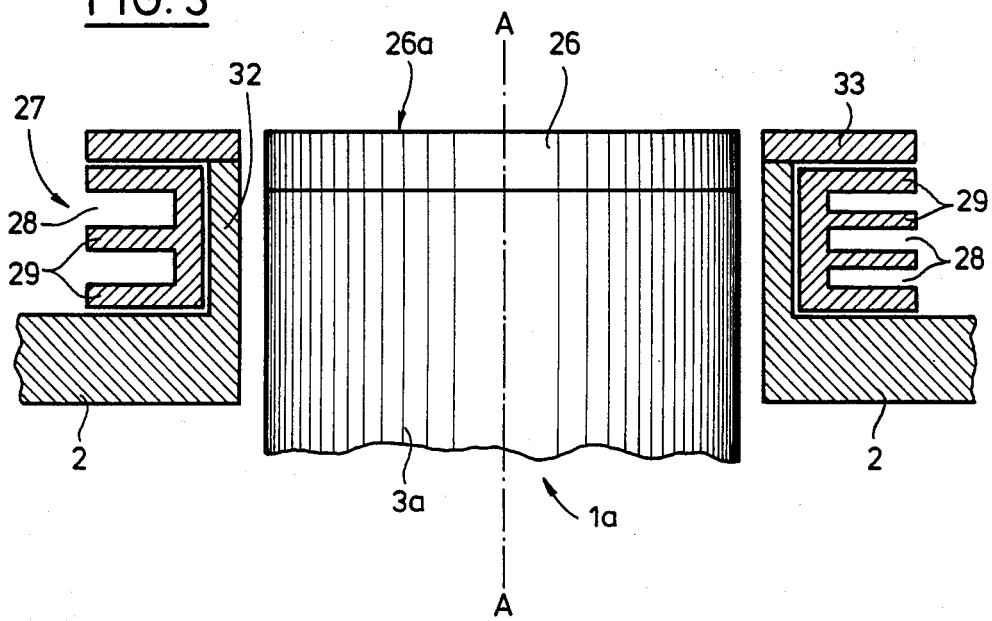
Figure 4:
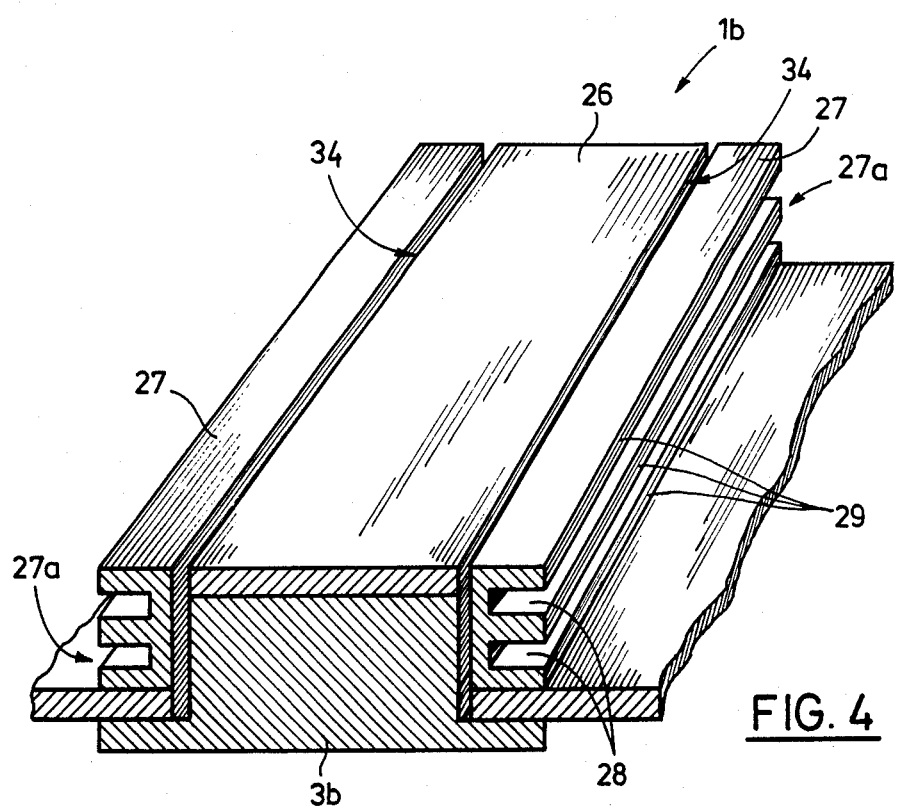
Figure 5:
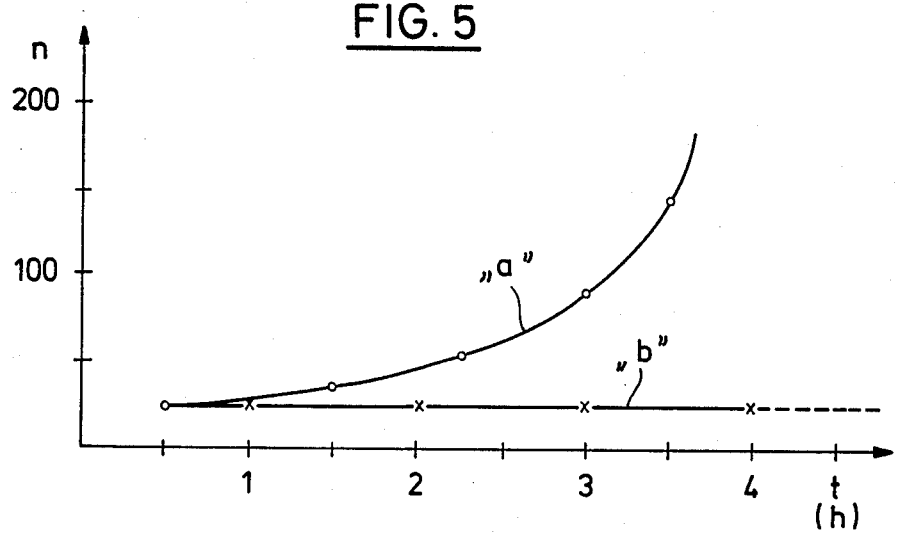
Figure 6:
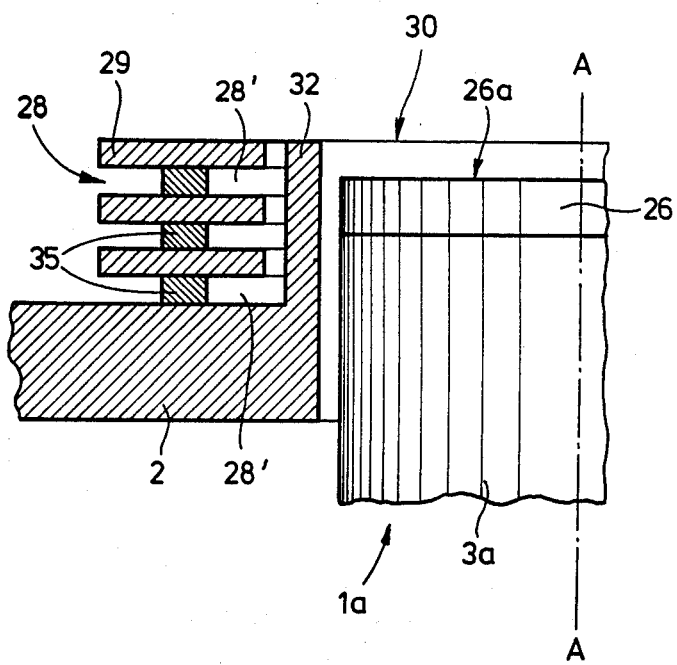

FIG. 1 shows an axial cross section through a rotationally symmetrical sputtering system in the form of a magnetron, FIG. 2 is a perspective representation of the subject of FIG. 1 cut away radially at an angle, FIG. 3 is a diagrammatic representation of a sputtering system in a position the reverse of FIG. 1, with a separate mounting for the anode, FIG. 4 is a fragmentary view of an elongated sputtering system having elongated anodes disposed on both sides, FIG. 5 is a graph representing the number of flashovers occurring over a period of time for purposes of comparison, and FIG. 6 is a variant of the anode of FIG. 3.

In FIGS. 1 and 2 a sputtering system 1 based on the magnetron principle is represented, which is inserted into a wall 2 of a vacuum chamber not shown in detail. Part of the sputtering system 1 is a pot-like cathode base body 3 which consists of a planar bottom plate 4 and a circumferential flange margin 5. Above the bottom plate 4 there is a magnet system consisting of a plurality of permanent magnets 6 and 7, in which the polarity is indicated by arrows. The permanent magnets 6 and 7 are surmounted by a magnet yoke 8 which closes the magnetic circuit. This is a typical magnetron system.

Into the top surface of the bottom plate 4 there is machined a coolant channel 9 which is covered by a liquid-tight plate 10. The coolant channel is connected at connectors 11 and 12 to a coolant circuit. The cathode base body 3 consists of a material of good thermal conductivity, preferably copper.

A rotationally symmetrical insulator 13 is sealingly placed on top of the cathode base body by means of tightening screws 14 which pass through the insulator 13 and the magnet yoke 8. The insulator 13 is surmounted by a metal pressure plate 15 engaged by the heads of the tightening screws. To achieve sufficient insulation against the wall 2 of the vacuum chamber, the insulator 13 is surrounded on the circumference of the pressure plate 15 by an annular projection 16 whose length corresponds to the thickness of the wall 2. On the inside of the vacuum chamber wall 2 there is a retaining ring 17 which is fastened to the wall 2 by screws 18. The cathode base body 3 with the insulator 13 is fastened to the wall 2 as follows: A clamp ring 19 having a flange 20 and a collar 21 is fastened to the retaining ring 17 by means of screws 22. The clamping ring 19 thus overlaps an outer margin 23 of the insulator 13 and forces the latter against the retaining ring 17. Thus an annular gasket 24 between the insulator 13 and the wall 2 is deformed to such an extent that a vacuum-tight seal is assured.

It can be seen from FIG. 1 and 2 that the cathode base body 3 is fastened so as to be insulated from the wall 2. The cathode base body 3 consists of a metal of good thermal conductivity, such as copper for example. On the other hand, the clamping ring 19, consisting of metal, is fastened to the wall 2 by the retaining ring 17 which also consists of metal and therefore it is at the ground potential. Between the clamping ring 19 and its collar 21 on the one hand and the cathode base body 3 on the other there is an air gap 25 of such dimensions that no glow discharge can burn in this air gap at the commonly used levels of working vacuums. The clamping ring 19 therefore constitutes the conventional dark-space shield.

The bottom plate 4 is faced with a plate-like target 26 of congruent dimensions which is fastened to it by a soldering process, for example. In the present case the target 26 is in the form of a disk.

The parts of the sputtering system thus far described are state of the art. In this case the collar 21 performs the anode function, and the undesirable deposits of material are observed at this point.

Now, in accordance with the invention, a special anode 27 is disposed in the marginal area of the target, which in the present case has two open grooves 28 defined by plane-parallel walls. These grooves are situated on a side of the anode 27 that is not in line of sight with the target 26. If the anode 27 is imagined as being made by machining the grooves 28 in a solid ring, the grooves run inwardly from the external cylindrical surface of this ring. The result is that it is very hard for the coating material to reach the bottom of the grooves. However, the electrons emerging from the glow discharge can very easily enter the adjacent wall surfaces of the anode 27 within the grooves. The comb-like cross section of the anode can be configured in many different ways. It is not necessary for the ribs 29 between the grooves to have all the same height or to be in precisely radial planes. For example, the side walls of the grooves can also lie in cone surfaces, and it is possible to provide the outermost rib with a larger diameter so as to further impair access of coating material to the grooves 28.

It can likewise be understood from FIGS. 1 and 2 that the face 30 of the anode 27 lies substantially in the same plane with the sputtering surface 26a of the target 26. In the present case the face 30 is even slightly forward of the sputtering surface 26a. This situation develops anyway in the course of the consumption of the target material, since the target 26 is consumed to the extent that coating material is deposited on the substrate (not shown). The substrate is to be considered as facing the sputtering surface 26a and parallel therewith.

As it is furthermore apparent from FIGS. 1 and 2, in the rotationally symmetrical system shown therein, the anode 27 consists of a hollow cylindrical core 31 and of ribs 29 disposed vertically on the core. The anode 27 can be fastened on the collar 21, for example by radial set screws, a bayonet joint or the like, so as to be easily replaceable.

FIG. 3 shows in a much more schematic manner a similar sputtering system 1a with a target 26. In this case, however, the wall 2 is provided with a collar 32 having a retaining ring 33 at its outer end. In the present case the arrangement is reversed, i.e. the sputtering surface 26a is facing upwardly into the interior of the vacuum chamber the same as the retaining ring 33. The retaining ring 33 serves to hold the anode 27, which in this figure has three ribs 29 and two grooves 28 on the left side, and four ribs 29 and three grooves 28 on the right side. In this protected embodiment, the flaking off of material concentrated on the anode is virtually impossible. The collar 32 serves in this case too for the dark-space shielding; the insulators which are also necessary here have been omitted from the drawing for the sake of simplicity.

FIG. 4 shows a section from a sputtering system 1b, which in this case has a rectangular cathode base 3b and a rectangular target 26. The target 26 is in this case defined by parallel longitudinal sides 34 and the anode 27 consists of two side pieces 27a parallel to the longitudinal sides 34 and having laterally projecting ribs 29 enclosing two grooves 28 between them. The side pieces 27a are in a mirror-image relationship and have basically the same cross section as the rotationally symmetrical anodes in FIGS. 1 to 3. It is not necessary that the anodes of FIG. 4 be joined together at their extremities by crosspieces, but this is possible.

In FIG. 5, the time t in hours is plotted on the abscissas, and the number n of the flashovers is plotted on the ordinates.

The curve a shows the progressive increase in the flashovers in a system in accordance with FIGS. 1 and 2, in which the smooth collar 21 alone performs the anode function (state of the art). It is to be noted that the number of flashovers after a period of opertion of about one hour increases drastically, so that longer operation of such a sputtering system is not possible.

The curve b shows the conditions in the case of the subject matter of the invention in accordance with FIGS. 1 and 2. Even after four hours of sputtering, no increase in the flashovers was found. The same cathode continued to be used for a period of more than 20 hours, without any fundamental change in this performance.

FIG. 6 shows the possibility of constructing the anode in the form of a stack of sheet metal rings or strips held apart from one another and from the wall 2 at such a distance that ribs 29 are formed, between which are the grooves 28. In the present case the separators 35, which are of annular or strip configuration, are formed approximately in the center of the rib cross section, so that additional grooves 28' are formed on the opposite side. These grooves are not in line of sight with the target, either, since they are blocked from it by the collar 32 from which they are divided by a gap. In the manner thus described, the number of labyrinths in increased, i.e., doubled, and manufacture of the anode from the described stack of rings or strips is greatly simplified and reduced in cost. It is furthermore shown that the outer boundary surface 30 protrudes considerably beyond the target surface 26a. This does not prove disadvantageous, either, because the direct line-of-sight association between the target and the grooves is still interrupted by the collar 32.

We claim:

1. Sputtering system for cathode sputtering apparatus, comprising: a cathode base body having a target with a sputtering surface of a material to be sputtered, a dark-space shield separated by an air gap from the cathode base body, and an anode disposed in the area of the margin of the target and having at least one groove opening in a side of the anode that is not in the line of sight of the target, the anode (27) being disposed on the margin of the dark-space shield (19) and side walls of the at least one groove (28) thereof being aligned substantially parallel to the sputtering surface (26a) of the target (26).

2. Sputtering system of claim 1, characterized in that the ratio of groove depth (T) to groove width (B) amounts to at least 2.5:1.

3. Sputtering system of claim 1, characterized in that the front boundary surface (30) of the anode (27) lies in substantially one plane with the sputtering surface (26a) of the unused target (26).

4. Sputtering system of claim 1, characterized in that, in the case of a rotationally symmetrical target (26) the anode (27) consists of a hollow cylindrical supporting ring (31) concentric with the cathode axis A—A and of radial circumferential ribs (29) going out from the supporting ring, which enclose between them at least one groove (28).

5. Sputtering system of claim 1, characterized in that, in the case of a target (26) defined by parallel longitudinal sides (34) the anode consists of two side pieces (17a) parallel to the longitudinal sides, which enclose between them at least one groove (28).

* * * * *

UNITED STATES PATENT AND TRADEMARK OFFICE
CERTIFICATE OF CORRECTION

PATENT NO. : 4,619,755

DATED : October 28, 1986

INVENTOR(S) : Gerhard Hessberger et al

It is certified that error appears in the above-identified patent and that said Letters Patent is hereby corrected as shown below:

On the Title Page:

[73] Assignee:, "Hans Zapfe, Rodgau-3, Fed. Rep. of Germany" should be --Leybold-Heraeus GmbH, Cologne, Fed. Rep. of Germany--

Column 1, line 61, "gretly" should be --greatly--

Column 2, line 36, "gret" should be --great--

Column 2, line 40, "(dielectrics" should be --(dielectrics)--

Column 6, line 22, "opertion" should be --operation--

Column 6, line 42, "in increased" should be --is increased--

Signed and Sealed this

Fifteenth Day of December, 1987

Attest:

DONALD J. QUIGG

Attesting Officer

Commissioner of Patents and Trademarks